United States Patent
Watanabe et al.

(10) Patent No.: US 10,288,782 B2
(45) Date of Patent: May 14, 2019

(54) INFRARED REFLECTIVE FILM

(71) Applicant: NITTO DENKO CORPORATION, Osaka (JP)

(72) Inventors: Masahiko Watanabe, Toyohashi (JP); Yutaka Ohmori, Toyohashi (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 199 days.

(21) Appl. No.: 14/765,296

(22) PCT Filed: Jan. 30, 2014

(86) PCT No.: PCT/JP2014/052147
§ 371 (c)(1),
(2) Date: Jul. 31, 2015

(87) PCT Pub. No.: WO2014/119677
PCT Pub. Date: Aug. 7, 2014

(65) Prior Publication Data
US 2016/0003989 A1 Jan. 7, 2016

(30) Foreign Application Priority Data

Jan. 31, 2013 (JP) .................................. 2013-017024
Jan. 21, 2014 (JP) .................................. 2014-008888

(51) Int. Cl.
*G02B 5/08* (2006.01)
*G02B 5/26* (2006.01)
(Continued)

(52) U.S. Cl.
CPC ............ *G02B 5/0875* (2013.01); *C23C 14/08* (2013.01); *C23C 14/086* (2013.01); *C23C 14/14* (2013.01);
(Continued)

(58) Field of Classification Search
None
See application file for complete search history.

(56) References Cited

U.S. PATENT DOCUMENTS 4,610,771 A 9/1986 Gillery et al.
4,622,120 A 11/1986 Gillery et al.
(Continued)

FOREIGN PATENT DOCUMENTS

CN 101909873 A 12/2010
CN 102395638 A 3/2012
(Continued)

OTHER PUBLICATIONS

Chinese Office Action for application No. 201410042960.4 dated Jun. 26, 2015.
(Continued)

*Primary Examiner* — Darryl J Collins
*Assistant Examiner* — Journey F Sumlar
(74) *Attorney, Agent, or Firm* — Hauptman Ham, LLP

(57) ABSTRACT

Disclosed is an infrared reflective film (100) configured by disposing an infrared ray reflective layer (20) and a transparent protective layer (30) on a transparent film backing (10) in this order. The infrared ray reflective layer (20) comprises: a first metal oxide layer (21); a metal layer (25) comprising a primary component consisting of silver; and a second metal oxide layer (22) comprised of a composite metal oxide containing zinc oxide and tin oxide, which are arranged in this order from the side of the transparent film backing (10). The transparent protective layer (30) lies in direct contact with the second metal oxide layer (22). The transparent protective layer (30) has a thickness of 30 nm to 150 nm, and is preferably an organic layer having a cross-
(Continued)

linked structure derived from an ester compound having an acidic group and a polymerizable functional group in the same molecule.

20 Claims, 1 Drawing Sheet

(51) Int. Cl.
*G02B 1/14* (2015.01)
*G02B 1/04* (2006.01)
*G02B 5/20* (2006.01)
*C23C 14/08* (2006.01)
*C23C 14/14* (2006.01)
*G02B 5/28* (2006.01)

(52) U.S. Cl.
CPC .................. *G02B 1/04* (2013.01); *G02B 1/14* (2015.01); *G02B 5/208* (2013.01); *G02B 5/26* (2013.01); *G02B 5/282* (2013.01)

(56) References Cited

U.S. PATENT DOCUMENTS

| | | | |
|---|---|---|---|
| 4,716,086 A | 12/1987 | Gillery et al. | |
| 4,786,563 A | 11/1988 | Gillery et al. | |
| 4,948,677 A | 8/1990 | Gillery et al. | |
| 6,021,338 A | 2/2000 | Zahora | |
| 6,030,671 A * | 2/2000 | Yang | B32B 17/10009 359/354 |
| 6,040,939 A * | 3/2000 | Demiryont | C03C 17/36 359/360 |
| 9,034,459 B2 | 5/2015 | Condo et al. | |
| 2005/0238923 A1 | 10/2005 | Thiel | |
| 2007/0281184 A1 | 12/2007 | Thiel | |
| 2009/0161221 A1* | 6/2009 | Yang | G02B 5/0242 359/599 |
| 2010/0316852 A1 | 12/2010 | Condo et al. | |
| 2011/0308693 A1 | 12/2011 | Van Nutt et al. | |
| 2012/0052320 A1 | 3/2012 | Van Nutt et al. | |
| 2012/0145432 A1 | 6/2012 | Yamaguchi et al. | |
| 2012/0205135 A1 | 8/2012 | Yamaguchi et al. | |
| 2012/0219821 A1 | 8/2012 | Frank et al. | |
| 2013/0059137 A1 | 3/2013 | Hevesi et al. | |
| 2013/0105069 A1 | 5/2013 | Van Nutt et al. | |
| 2013/0107246 A1* | 5/2013 | Yang | G02B 5/208 356/51 |
| 2013/0279000 A1* | 10/2013 | Maeda | B32B 17/10018 359/360 |
| 2013/0279001 A1 | 10/2013 | Mochizuki et al. | |
| 2013/0342899 A1 | 12/2013 | Van Nutt et al. | |
| 2014/0065439 A1 | 3/2014 | Van Nutt et al. | |
| 2014/0072786 A1 | 3/2014 | Van Nutt et al. | |
| 2014/0098414 A1 | 4/2014 | Ohmori et al. | |
| 2014/0101919 A1 | 4/2014 | Van Nutt et al. | |
| 2014/0109916 A1* | 4/2014 | Langguth | A61K 9/7053 128/832 |
| 2014/0154486 A1* | 6/2014 | Kim | G02B 1/105 428/215 |

FOREIGN PATENT DOCUMENTS

| | | |
|---|---|---|
| CN | 102834258 A | 12/2012 |
| JP | 61111940 A | 5/1986 |
| JP | H10-087349 A | 4/1998 |
| JP | 10286900 A | 10/1998 |
| JP | 2003-104758 A | 4/2003 |
| JP | 2006-334787 A | 12/2006 |
| JP | 2007-250430 A | 9/2007 |
| JP | 2007-534603 A | 11/2007 |
| JP | 2009285864 A | 12/2009 |
| JP | 2011-006510 A | 1/2011 |
| JP | 2011509193 A | 3/2011 |
| JP | 2012-037634 A | 2/2012 |
| JP | 2012219007 A | 11/2012 |
| JP | 2013010341 A | 1/2013 |
| KR | 10-2007-0016203 A | 2/2007 |
| TW | 201236863 A | 9/2012 |
| WO | 2004-089620 A2 | 10/2004 |
| WO | 2011-109306 A2 | 9/2011 |
| WO | 2011109306 A2 | 9/2011 |
| WO | 2011147875 A1 | 12/2011 |
| WO | 2012096304 A1 | 7/2012 |
| WO | 2012120725 A1 | 9/2012 |

OTHER PUBLICATIONS

Preparation and Application of Water-based Resins, 2011, 20 pages.
Chinese Office Action for application No. 200880122804.1 dated Jun. 26, 2015.
Chinese Office Action dated Apr. 6, 2016 in connection with the counterpart Chinese Patent Application No. 201410042960.4.
International Search Report for PCT/JP2014/052147 dated Apr. 1, 2014.
Taiwanese Office Action for application 103103662 dated Feb. 9, 2015.
Japanese Office Action for application No. 2014-008888 dated Oct. 13, 2015.
Japanese Office Action dated Jan. 28, 2016 in connection with the counterpart Japanese Patent Application No. 2014-008888.
Japanese Office Action dated Dec. 4, 2017 in connection with the counterpart Japanese Patent Application No. 2016-169379.
Korean Office Action dated Oct. 27, 2017 from KIPO in connection with the counterpart Korean Patent Application No. 10-2017-7019930 with a partial translation.
Chinese Office Action dated May 24, 2018 for corresponding Chinese Application No. 201710030408.7, with partial English translation.

* cited by examiner

[Fig. 1]
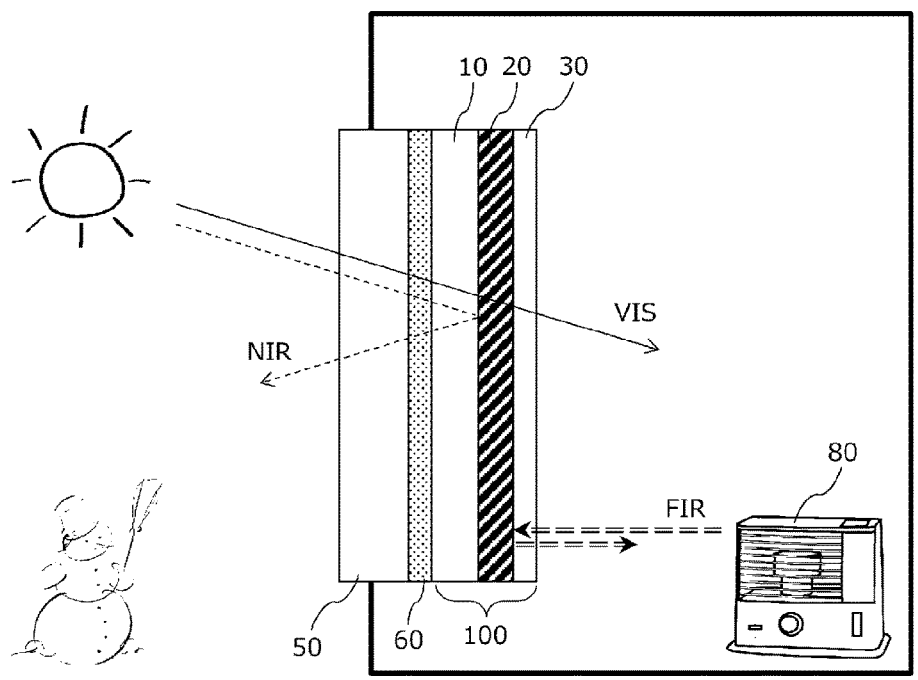
[Fig. 2]
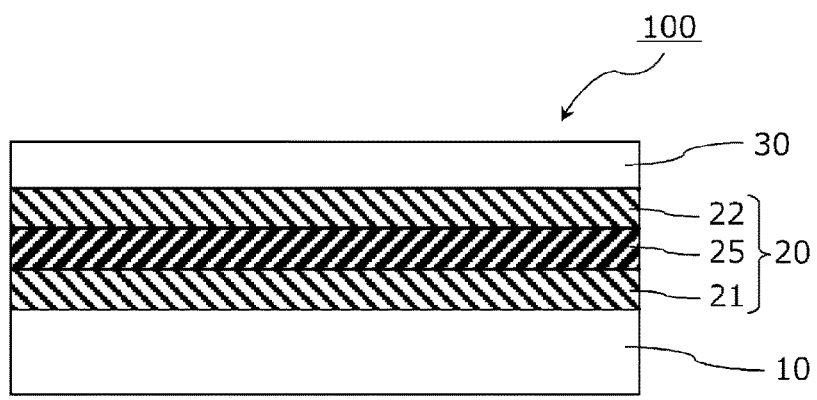

INFRARED REFLECTIVE FILM

TECHNICAL FIELD

The present invention relates to an infrared reflective film which is used, mainly, in a state of being disposed on an indoor side of a window glass. In particular, the present invention relates to an infrared reflective film having durability in actual use environments as well as excellent heat insulating property.

BACKGROUND ART

Theretofore, there has been known an infrared reflective substrate configured by disposing an infrared reflective layer on a backing such as glass or film. As the infrared reflective layer, a laminate obtained by alternately laminating a metal layer and a metal oxide layer is widely used. It functions to reflect near-infrared rays such as solar light to thereby impart heat insulating property. As the metal layer, silver or the like is widely used, from a viewpoint of enhancing a selective reflectivity in the infrared region. As the metal oxide layer, indium tin oxide (ITO) is widely used. The metal layer and the metal oxide layer are not sufficient in terms of physical strength such as abrasion-resistant. Moreover, they are apt to undergo degradation due to external environmental factors such as heat, ultraviolet rays, oxygen, water and/or chlorine (chloride ions). In view of this, generally, a protective layer is provided on the infrared reflective layer on a side opposite to the backing.

In late years, it has been attempted to reduce an emissivity of an infrared reflective film to provide enhanced heat insulating property. A key point for reduction in emissivity of an infrared reflective film is to effectively reflect far-infrared rays toward an indoor pace by a metal layer in an infrared reflective layer of the infrared reflective film. However, a film or a curable resin layer (hard coat layer) used as a protective film of the infrared reflective film generally contains a large amount of a compound comprising a C=C bond, a C=O bond, a C—O bond and an aromatic ring, and therefore exhibits large infrared vibrational absorption in a wavelength range of 5 μm to 25 μm within a far-infrared region. Far-infrared rays absorbed by the protective layer are thermally diffused toward an outdoor space by heat conduction, without being reflected by the metal layer. Thus, when an amount of far-infrared rays absorbed by the protective layer becomes larger, the emissivity of the infrared reflective film increases, resulting in failing to obtain a heat insulating effect.

With a view to reducing emissivity of an infrared reflective film, the following Patent Document 1 proposes a technique of reducing an amount of far-infrared rays to be absorbed by a protective layer, wherein a cured material layer such as cured fluorosilane is used as a transparent protective layer, and a thickness of the cured material layer is set to be equal to or less than 500 nm.

CITATION LIST

Patent Document

Patent Document 1: pamphlet of WO 2011/109306A

SUMMARY OF INVENTION

Technical Problem

According to inventors' studies, it was found that, in the case where the thickness of the transparent protective layer is set to several hundred nm, as disclosed in the Patent Document 1, an optical film thickness of the transparent protective layer overlaps the wavelength range of visible rays, thereby causing a problem that the infrared reflective film is visually observed as colored with a rainbow-like pattern, due to multiple interference at an interlayer interface (rainbow-like coloring phenomenon). As means to prevent the rainbow-like coloring phenomenon, it is effective to set the thickness of the transparent protective layer to be less than the wavelength range of visible rays. However, if the thickness of the transparent protective layer is reduced to several ten nm, a protective effect of the protective layer deteriorates, so that an infrared reflective layer, particular, a metal layer therein, is more likely to undergo degradation such as oxidation, due to deterioration in durability thereof. The degradation of the metal layer is liable to cause deterioration in heat insulating property and visible ray transmittance of the infrared reflective film.

The Patent Document 1 also discloses an example where the transparent protective layer is thinned to about 50 nm. In this example, in adjacent relation to a first metal layer such as silver in the infrared reflective layer, a highly-durable second metal layer such as Ni—Cr alloy is disposed to impart durability to the first metal layer. By adding the Ni—Cr alloy layer to the first metal layer, it is possible to obtain an infrared reflective film having durability, as well as heat shielding property based on reflection of near-infrared rays and heat insulating property based on reflection of far-infrared rays. However, the Ni—Cr alloy layer having a low visible ray transmittance causes a problem that a visible ray transmittance of the infrared reflective film is reduced to about 50%.

Moreover, a curable organic material for forming the transparent protective layer generally has poor adhesion with respect to a metal oxide layer. Thus, when a thickness of the transparent protective layer becomes smaller, there arises a problem that interlayer peeling between the metal oxide layer and the transparent protective layer is more likely to occur. As means to prevent the interlayer peeling, it is conceivable to additionally provide an adhesion layer, a primer layer or the like. However, the additional layer leads to an increase in amount of absorption of far-infrared rays, thereby causing another problem that the heat insulating property of the infrared reflective film deteriorates.

In view of the above, it is an object of the present invention to provide an infrared reflective film capable of exhibiting excellent heat insulating property and high durability by using a transparent protective layer having sufficient durability and a protective effect on an infrared reflective layer even when the transparent protective layer has a small thickness.

Solution to Technical Problem

As a result of studies, the inventors found that an infrared reflective film satisfying both durability and heat insulating property can be obtained by using, as a metal oxide layer disposed on a metal layer, a composite metal oxide containing zinc oxide and tin oxide, and allowing a transparent protective layer to contain a given compound, and have reached the present invention.

The present invention provides an infrared reflective film which is configured by disposing an infrared ray reflective layer and a transparent protective layer on a transparent film backing in this order. The infrared ray reflective layer comprises: a first metal oxide layer; a metal layer comprising a primary component consisting of silver; and a second metal oxide layer comprised of a composite metal oxide containing zinc oxide and tin oxide, which are arranged in this order from the side of the transparent film backing. The transparent protective layer lies in direct contact with the second metal oxide layer. The transparent protective layer is an organic layer having a cross-linked structure, wherein the cross-linked structure is preferably derived from an ester compound having an acidic group and a polymerizable functional group in the same molecule. As the ester compound, it is preferable to use an ester compound of a phosphoric acid with an organic acid having a polymerizable functional group. An amount of the ester compound-derived structure contained in the transparent protective layer is preferably 1 to 40 weight %. Further, the transparent protective layer preferably has a thickness of 30 nm to 150 nm.

Preferably, in the infrared reflective film of the present invention, a normal emissivity as measured from the side of the transparent protective layer is 0.2 or less. As long as the normal emissivity falls within this range, far-infrared rays from an indoor space are reflected toward the indoor space by the metal layer. Thus, the infrared reflective film has high heat insulating property.

Effect of Invention

The thickness of the transparent protective layer is as small as 150 nm or less, so that the infrared reflective film of the present invention can suppress the occurrence of the rainbow-like coloring phenomenon to thereby become excellent in external appearance and viewability. In addition, the small thickness of the transparent protective layer leads to a reduction in amount of far-infrared rays to be absorbed by the transparent protective layer, so that the infrared reflective film of the present invention becomes excellent in heat insulating property based on reflection of far-infrared rays toward the indoor space, as well as heat shielding property based on reflection of near-infrared rays, to thereby bring out an energy-saving effect throughout the year. Furthermore, the infrared reflective layer and the transparent protective layer are made, respectively, of the predefined materials, so that the infrared reflective film of the present invention becomes excellent in adhesion between the two layers, and can exhibit high durability despite the small thickness of the transparent protective layer.

BRIEF DESCRIPTION OF DRAWINGS

FIG. 1 is a sectional view schematically illustrating an example of how an infrared reflective film is used.

FIG. 2 is a sectional view schematically illustrating a laminate structure of an infrared reflective film according to one embodiment of the present invention.

DESCRIPTION OF EMBODIMENTS

An infrared reflective film according to the present invention will now be described by appropriately referring to the drawings. FIG. 1 is a sectional view schematically illustrating a usage mode of an infrared reflective film. An infrared reflective film 100 according to the present invention is configured by disposing an infrared ray reflective layer 20 and a transparent protective layer 30 on a transparent film backing 10. The infrared reflective film 100 is bonded to a window 50 through an appropriate adhesive layer 60 or the like in a posture where a surface of the transparent film backing 10 faces the window 50, and disposed on an indoor side of the window 50 of a building or an automobile. In this use mode, the transparent protective layer 30 is disposed on the indoor side.

As schematically illustrated in FIG. 1, the infrared reflective film 100 according to the present invention is capable of transmitting visible rays (VIS) from an outdoor space to introduce it into an indoor space, while reflecting near-infrared rays from the outdoor space by the infrared reflective layer 20. Based on the reflection of near-infrared rays, it is possible to suppress inflow of heat caused by solar light and others, from the outdoor space into the indoor space (bring out a heat shielding effect), and thus enhance cooling efficiency in summer. In addition, the infrared reflective layer 20 is capable of reflecting indoor far-infrared rays (FIR) emitted from a heating device 80 or the like, so that it is possible to bring out a heat insulating effect, and thus enhance heating efficiency in winter.

[Infrared Reflective Film]

As illustrated in FIG. 2, the infrared reflective film 100 is configured by disposing the infrared ray reflective layer 20 and the transparent protective layer 30 on one principal surface of the transparent film backing 10, in this order. The infrared ray reflective layer 20 comprises a first metal oxide layer 21, a metal layer 25, and a second metal oxide layer 22, which are arranged in this order from the side of the transparent film backing 10. The transparent protective layer 30 lies in direct contact with the second metal oxide layer 22 of the infrared ray reflective layer 20.

For reflecting indoor far-infrared rays by the infrared reflective layer 20, it is important that an amount of far-infrared rays to be absorbed by the transparent protective layer 30 is sufficiently small. On the other hand, the transparent protective layer 30 requires mechanical strength and chemical strength for preventing abrasion and degradation of the infrared reflective layer 20. The infrared reflective film according to the present invention is configured to have a given laminate structure, so that it can balance heat insulating property based on reflection of infrared rays with durability. The layers making up the infrared reflective film will be described one-by-one below.

[Transparent Film Backing]

As the transparent film backing 10, it is possible to use, for example, a flexible transparent resin film. The transparent film backing is preferably made of a material having a visible ray transmittance of 80% or more. In this specification, the visible ray transmittance is measured according to JIS A5759-2008 (films for building glazings).

A thickness of the transparent film backing 10 is preferably set to, but not particularly limited to, the range of about 10 to 300 μm. In some cases, a process of forming the infrared reflective layer 20 on the transparent film backing 10 is performed at high temperatures. Thus, a resin material of the transparent film backing is preferably excellent in heat resistance. Examples of the transparent film backing include polyethylene terephthalate (PET), polyethylene naphthalate (PEN), polyether ether ketone (PEEK), and polycarbonate.

With a view to enhancing mechanical strength of the infrared reflective film, etc., a hard coat layer is preferably provided on a surface of the transparent film backing 10 on which the infrared reflective layer 20 is to be formed. The hard coat layer may be provided, for example, by additionally forming a cured coating made of an appropriate ultraviolet-curable resin, such as acrylic-based resin or silicone-based resin, onto the transparent film backing. The hard coat layer is preferably made of a material having high hardness.

With a view to enhancing adhesion with respect to the infrared reflective layer 20, etc., the surface of the transparent film backing 10 or a surface of the hard coat layer may be subjected to a surface modification treatment, such as corona treatment, plasma treatment, flame treatment, ozone treatment, primer treatment, glow treatment, saponification treatment, or treatment using a coupling agent.

[Infrared Reflective Layer]

The infrared reflective layer 20 is capable of transmitting visible rays and reflecting near-infrared rays and far-infrared rays, and comprises a first metal oxide layer 21, a metal layer 25, and a second metal oxide layer 22, which are arranged in this order from the side of the transparent film backing 10.

<Metal Layer>

The metal layer 25 has a key roll in reflection of infrared rays. In the present invention, a silver layer or a silver alloy layer which comprises a primary component consisting of silver is preferably used, from a viewpoint of enhancing visible ray transmittance and infrared reflectance. Silver has a high free electron density, so that it can realize a high reflectance to near-infrared and far-infrared rays, and provide an infrared reflective film excellent in heat insulating effect and heat shielding effect, even in a situation where the infrared reflective layer 20 is made up of a small number of layers.

An amount of silver contained in the metal layer 25 is preferably 90 weight % or more, more preferably, 93 weight % or more, further more preferably, 95 weight %, particularly preferably, 96 weight %. By increasing the amount of silver contained in the metal layer, it is possible to enhance wavelength selectivity in transmittance and reflectance, and thus enhance visible ray transmittance of the infrared reflective film.

The metal layer 25 may be a silver alloy layer containing a metal other than silver (non-silver metal). For example, there are some cases where a silver alloy is used to enhance durability of the metal layer. As a metal to be added to the metal layer for enhancing its durability, it is preferable to use, for example, palladium (Pd), gold (Au), copper (Cu), bismuth (Bi), germanium (Ge) or gallium (Ga). Among them, Pd is most preferably used, from a viewpoint of imparting high durability to silver. When an amount of the metal additive such as Pd is increased, durability of the metal layer tends to be enhanced. In the case where the metal layer 25 contains a non-silver metal, such as Pd, the content of the metal is preferably 0.3 weight % or more, more preferably, 0.5 weight %, further more preferably, 1 weight % or more, particularly preferably, 2 weight % or more. On the other hand, when the amount of the metal additive such as Pd is increased and the content of silver is reduced accordingly, the visible ray transmittance of the infrared reflective film tends to decrease. Therefore, the amount of the non-silver metal contained in the metal layer 25 is preferably 10 weight % or less, more preferably, 7 weight % or less, further more preferably, 5 weight % or less, particularly preferably, 4 weight % or less.

<Metal Oxide Layers>

Each of the metal oxide layers 21, 22 is provided with a view to controlling an amount of reflection of visible rays at an interface with the metal layer 25 to thereby satisfy both higher visible ray transmittance and higher infrared reflectance, etc. Each of the metal oxide layers also functions as a protective layer for preventing degradation of the metal layer 25. From a viewpoint of enhancing wavelength selectivity in reflection and transmission, a refractive index of each of the metal oxide layers 21, 22 with respect to visible rays is preferably 1.5 or more, more preferably, 1.6 or more, further more preferably, 1.7 or more.

Examples of a material having the above refractive index include an oxide of at least one metal selected from the group consisting of Ti, Zr, Hf, Nb, Zn, Al, Ga, In, Tl, Ga and Sn, or a composite oxide of two or more of them. Particularly, in the present invention, as the second metal oxide layer 22 provided on the metal layer 25 on the side of the transparent protective layer 30, it is preferable to use a composite metal oxide containing zinc oxide and tin oxide. The zinc oxide and tin oxide-containing composite metal oxide is excellent in chemical stability (durability against acid, alkali, chloride ion and the like), and excellent in adhesion with respect to the transparent protective layer 30 as described in detail later. Thus, the second metal oxide layer 22 and the transparent protective layer 30 act synergistically to enhance a protective effect on the metal layer 25.

An amount of zinc atoms contained in the second metal oxide layer 22 is preferably 10 to 60 atomic %, more preferably, 15 to 50 atomic %, further more preferably, 20 to 40 atomic %, with respect to a total amount of metal atoms. If the content of zinc atoms (zinc oxide) is excessively small, the resulting metal oxide layer becomes crystalline. This is likely to cause deterioration in durability. Moreover, if the content of zinc atoms (zinc oxide) is excessively small, an electrical resistance of a sputtering target for use in film formation increases. This is liable to cause difficulty in film formation by a DC sputtering process. On the other hand, if the content of zinc atoms is excessively large, deterioration in durability of the infrared reflective layer, adhesion between the second metal oxide layer 22 and the metal layer 25, etc., is likely to occur.

An amount of tin atoms contained in the second metal oxide layer 22 is preferably 30 to 90 atomic %, more preferably, 40 to 85 atomic %, further more preferably, 50 to 80 atomic %, with respect to the total amount of metal atoms. If the content of tin atoms (tin oxide) is excessively small, chemical durability of the metal oxide layer tends to deteriorate. On the other hand, if the content of tin atoms (tin oxide) is excessively large, an electrical resistance of a sputtering target for use in film formation increases. This is liable to cause difficulty in film formation by a DC sputtering process.

In addition to zinc oxide and tin oxide, the second metal oxide layer may further contain at least one metal selected from the group consisting of Ti, Zr, Hf, Nb, Al, Ga, In, Tl or Ga, or a metal oxide thereof, for example. Such a metal or metal oxide may be added with a view to enhancement in electrical conductivity of the target during film formation to thereby provide a higher film formation rate; enhancement in transparency of the second metal oxide layer, etc. A total amount of zinc atoms and tin atoms contained in the second metal oxide layer is preferably 40 atomic % or more, more preferably, 50 atomic % or more, further more preferably, 60 atomic %, with respect to the total amount of metal atoms.

As a material making up the first metal oxide layer 21, it is possible to use one of various metal oxides. From a viewpoint of enhancing durability and enhancing productivity, it is preferable to use a composite metal oxide containing zinc oxide and tin oxide, as with the second metal oxide layer.

Respective thicknesses of the metal layer 25 and the first and second metal oxide layers 21, 22 are appropriately set to allow the infrared reflective layer to transmit visible rays while selectively reflecting near-infrared rays, considering refractive indexes of respective materials thereof. Specifically, the thickness of the metal layer 25 may be adjusted, for example, within the range of 3 to 50 nm. The thickness of each of the first and second metal oxide layers 21, 22 may be adjusted, for example, within the range of 3 to 80 nm. Each of the metal layer and the metal oxide layers is preferably formed by, but not particularly limited to, a dry process, such as a sputtering process, a vacuum vapor deposition process, a CVD process or an electron-beam deposition process.

From a viewpoint of realizing a high film formation rate, it is preferable to form the metal oxide layers 21, 22 by a DC sputtering process using a target containing a metal and a metal oxide. Zinc tin oxide (ZTO) has a low electrical conductivity. Thus, a sintered target containing only zinc oxide and tin oxide has a high resistivity, thereby causing difficulty in film formation by a DC sputtering process. A reactive sputtering process using a metal target containing zinc and tin is performed in an oxygen atmosphere. Thus, during formation of a film of ZTO on the metal layer, the metal layer serving as a foundation layer for film formation is oxidized by excess oxygen. This is likely to cause a problem of degradation in properties of the infrared reflective layer. Therefore, particularly, in the case where a metal oxide layer made of ZTO is formed as the second metal oxide layer 22 on the metal layer 25, it is preferable to perform film formation by a DC sputtering process using a target prepared by sintering a mixture of zinc oxide, tin oxide and a metal. In this case, the target is preferably formed by sintering a mixture of a metal contained, preferably, in an amount of 0.1 to 20 weight %, more preferably, in an amount of 0.2 to 15 weight %, and zinc oxide and/or tin oxide. If the amount of the metal contained in the formed target is excessively small, the target becomes insufficient in electrical conductivity. This is likely to cause difficulty in film formation by the DC sputtering process and deterioration in adhesion with respect to the metal layer. On the other hand, if the amount of the metal contained in the formed target is excessively large, the visible ray transmittance of the metal oxide layer tends to deteriorate due to an increase in amount of a remaining part of the metal un-oxidized during film formation and an increase in amount of metal oxide having an oxygen amount less than a stoichiometric composition amount. A metal to be contained in the target is preferably zinc and/or tin, but any metal other than them may be contained in the target.

In the case where a ZTO metal oxide layer is formed using a target prepared by sintering a mixture of a metal oxide and a metal, an amount of oxygen introduced in a film formation chamber is preferably 8 volume % or less, more preferably 5 volume % or less, further more preferably, 4 volume % or less, with respect to a total flow volume of the introduced gas. A reduction of an oxygen introduction amount makes it possible to prevent oxidation of the metal layer during formation of the metal oxide layer. The oxygen introduction amount means an amount (volume %) of oxygen with respect to a total amount of gas introduced into the film formation chamber in which a target for use in formation of the metal oxide layer is disposed. In the case where a sputtering film formation apparatus equipped with a plurality of film formation chambers separated by shielding plates, the oxygen introduction amount is calculated on the basis of an amount of gas introduced into each of the separated film formation chambers.

<Laminate Structure of Infrared Reflective Layer>

The infrared reflective layer 20 may be composed of three layers consisting of the first metal oxide layer 21, the metal layer 25 and the second metal oxide layer 22, or may further include one or more layers in addition to the three layers. For example, with a view to enhancement in adhesion between the metal layer 25 and each of the metal oxide layers 21, 22, imparting of durability to the metal layer, etc, an additional layer such as a metal layer or a metal oxide layer may be provided therebetween. Further, another additional layer such as a metal layer or a metal oxide layer may be added onto the first metal oxide layer 21 on the side of the transparent film backing 10. In this way, the number of layers may be increased to allow the infrared reflective layer 20 to be formed in a five or more-layer structure such as a five-layer structure or a seven-layer structure, thereby enhancing wavelength selectivity in transmission of visible rays and reflection of near-infrared rays.

On the other hand, from a viewpoint of enhancement in productivity and reduction in production cost, the infrared reflective layer 20 is preferably composed of three layers consisting of the first metal oxide layer 21, the metal layer 25 and the second metal oxide layer 22. In the present invention, a given transparent protective layer is laminated directly onto the second metal oxide layer 22 to thereby impart high durability, as described in detail later, so that it becomes possible to obtain an infrared reflective film having sufficient durability enough to endure practical use, even when the infrared reflective layer has a three-layer structure.

[Transparent Protective Layer]

With a view to preventing abrasion and degradation of the infrared reflective layer, the transparent protective layer 30 is provided on the second metal oxide layer 22 of the infrared reflective layer 20. In the present invention, the transparent protective layer 30 lies in direct contact with the second metal oxide layer 22.

A material for the transparent protective layer 30 is preferably a type which is high in terms of visible ray transmittance and excellent in terms of mechanical strength and chemical strength. In the present invention, an organic material is used as a material for the transparent protective layer 30. As the organic material, it is preferable to use an active light-curable or heat-curable organic resin, such as fluorine-based resin, acrylic-based resin, urethane-based resin, ester-based resin or epoxy-based resin, and an organic and inorganic hybrid material as a result of chemical bonding between an organic component and an inorganic component. In the present invention, in addition to being made of the above organic material, the transparent protective layer 30 has a cross-linked structure derived from an ester compound having an acidic group and a polymerizable functional group in the same molecule.

Examples of the ester compound having an acidic group and a polymerizable functional group in the same molecule include an ester of: a polyhydric acid such as phosphoric acid, sulfuric acid, oxalic acid, succinic acid, phthalic acid, fumaric acid, or maleic acid; a compound having in the molecule a hydroxyl group and a polymerizable functional group such as ethylenic unsaturated group, silanol group, or epoxy group. While the ester compound may be a polyhydric ester such as diester or triester, it is preferable that at least one of acidic groups of the polyhydric acid is unesterified.

The transparent protective layer 30 has the ester compound-derived cross-linked structure, so that the transparent protective layer 30 can have enhanced mechanical and chemical strength and enhanced adhesion with respect to the second metal oxide layer 22 to thereby provide enhanced durability of the infrared reflective layer. Among the above ester compounds, an ester compound of a phosphoric acid with an organic acid having a polymerizable functional group (phosphoric ester compound) is preferable from a viewpoint of enhancing adhesion between the transparent protective layer and the metal oxide layer. The enhancement in adhesion between the transparent protective layer and the metal oxide layer comes from the fact that the acidic group contained in the ester compound exhibits high affinity for the metal oxide, particularly, a phosphoric hydroxyl group contained in the phosphoric ester compound is excellent in affinity for the metal oxide layer.

From a viewpoint of enhancing mechanical and chemical strength of the transparent protective layer 30, the ester compound preferably contains a (meth)acryloyl group as a polymerizable functional group. The ester compound may have a plurality of polymerizable functional groups in the molecule. As the ester compound, it is preferable to use a phosphoric monoester compound or a phosphoric diester compound which is expressed by the following chemical formula (1). It is to be understood that the phosphoric monoester compound and the phosphoric diester compound may be used in combination.

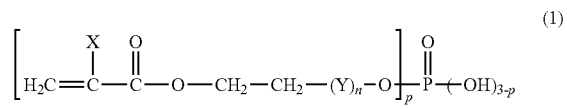

(1)

In the chemical formula, X represents a hydrogen atom or a methyl group, and (Y) represents a —OCO(CH$_2$)$_5$— group. Further, n represents 0 or 2, and p represents 1 or 2.

An amount of the ester compound-derived structure contained in the transparent protective layer is preferably 1 to 40 weight %, more preferably, 1.5 to 35 weight %, further more preferably, 2 to 20 weight %, still further more preferably, 2.5 to 17.5 weight %. In a particularly preferred embodiment, the ester compound-derived structure contained in the transparent protective layer is 2.5 to 15 weight %, or 2.5 to 12.5 weight %. If the content of the ester compound-derived structure is excessively small, the strength and adhesion enhancing effects cannot be sufficiently obtained in some cases. On the other hand, if the content of the ester compound-derived structure is excessively large, a curing speed during formation of the transparent protective layer decreases, thereby causing deterioration in hardness thereof, and sliding property of a surface of the transparent protective layer deteriorates, thereby causing deterioration in abrasion resistance, in some cases. The amount of the ester compound-derived structure contained in the transparent protective layer can be set to a desired range by adjusting an amount of the ester compound to be contained in a composition of the transparent protective layer, during formation of the composition first layer.

A formation method for the transparent protective layer 30 is not particularly limited. Preferably, the transparent protective layer is formed, for example, by: dissolving the above organic material or a curable monomer or oligomer of the above organic material, and the above ester compound, in a solvent, to prepare a solution; applying the solution onto the second metal oxide layer 22 of the infrared reflective layer; drying the solvent of the applied solution; and then curing the dried product by means of irradiation with ultraviolet rays or an electron beam, or imparting of heat energy.

In addition to the organic material and the ester compound, the material for the transparent protective layer 30 may contain additives such as: a coupling agent including a silane coupling agent and a titanium coupling agent; a leveling agent; an ultraviolet absorber; an antioxidant; a stabilizer such as a lubricant for a heat stabilizer; a plasticizer; a coloration inhibitor; a flame retardant; and an antistatic agent. The content of these additives may be appropriately adjusted without impairing the object of the present invention.

A thickness of the transparent protective layer 30 is preferably 30 to 150 nm, more preferably, 35 to 130 nm, further more preferably, 40 to 110 nm, particularly preferably, 45 to 100 nm. If the thickness of the transparent protective layer is excessively large, the heat insulating property of the infrared reflective film tends to deteriorate due to an increase in amount of far-infrared rays absorbed by the transparent protective layer. Further, in view of the fact that, if an optical film thickness of the transparent protective layer overlaps the wavelength range of visible rays, the rainbow-like coloring phenomenon occurs due to multiple interference at an interlayer interface, it is preferable to minimize the thickness of the transparent protective layer. In the present invention, the transparent protective layer 30 is enhanced has the given ester compound-derived cross-linked structure, and the zinc oxide and tin oxide-containing composite metal oxide is used as a material for the second metal oxide layer 22, so that durability of the infrared reflective film is enhanced. This makes it possible to obtain an infrared reflective film having excellent durability even when the thickness of the transparent protective layer is 150 nm or less. The durability is further enhanced by employing as the metal layer 25 a silver alloy containing a metal such as Pd, as mentioned above. Thus, it becomes possible to reduce the thickness of the transparent protective layer, while maintaining the desired durability.

[Laminate Structure of Infrared Reflective Film]

The he infrared reflective film 100 of the present invention 100 is configured by disposing the infrared reflective layer 20 comprising the metal layer and the metal oxide layers, and the transparent protective layer 30, on one principal surface of the transparent film backing 10, as mentioned above. The transparent protective layer 30 is formed directly on the second metal oxide layer 22. With a view to enhancement in interlayer adhesion, increase in strength of the infrared reflective film, etc., an additional layer such as a hard coat layer or an easy-adhesion layer may be provided between the transparent film backing 10 and the infrared reflective layer 20. While a material and a formation method for the additional layer such as an easy-adhesion layer or a hard coat layer are not particularly limited, it is preferable to use a transparent material having a high visible ray transmittance.

The adhesive layer for use in bonding the infrared reflective film to a window glass or the like may be additionally provided on a surface of the transparent film backing 10 on a side opposite to the infrared reflective layer 20. As the adhesive layer, it is preferable to use a type having a high visible ray transmittance and a small difference in refractive index with respect to the transparent film backing 10. For example, an acrylic-based pressure-sensitive adhesive is suitable as a material for the adhesive layer additionally provided on the transparent film backing 10, because it exhibits excellent optical transparency, moderate wettability, aggregability and adhesiveness, and excellent durability such as weather resistance and heat resistance.

Preferably, the adhesive layer is a type having a high visible ray transmittance, and a low ultraviolet transmittance. By reducing the ultraviolet transmittance of the adhesive layer, it is possible to suppress degradation of the infrared reflective layer due to ultraviolet rays of solar light or the like. From a viewpoint of reducing the ultraviolet transmittance of the adhesive layer, the adhesive layer preferably contains an ultraviolet absorber. Alternatively, for example, the transparent film backing may contain an ultraviolet absorber. In this case, it is also possible to suppress degradation of the infrared reflective layer due to ultraviolet rays from an outdoor space. Preferably, with a view to preventing contamination of an exposed surface of the adhesive layer, a separator is temporarily attached to the exposed surface to cover it until the infrared reflective film is actually used. This makes it possible to prevent contamination of the exposed surface of the adhesive layer due to contact with outside environment.

[Properties of Infrared Reflective Film]

In the infrared reflective film of the present invention, a normal emissivity as measured from the side of the transparent protective layer 30 is preferably 0.20 or less, more preferably, 0.15 or less, further more preferably, 0.12 or less, particularly preferably, 0.10 or less. In this specification, the normal emissivity is measured according to JIS R3106: 2008 (Testing method for transmittance, reflectance, emissivity and solar heat gain coefficient of sheet glasses). A variation in emissivity as measured after the infrared reflective film is immersed in an aqueous solution containing 5 weight % of sodium chloride for 5 days is preferably 0.02 or less, more preferably, 0.01. A visible ray transmittance of the infrared reflective film is preferably 60% or more, more preferably 65% or more, further more preferably, 67% or more. As described above, in the present invention, respective materials and thicknesses of layers making up the infrared reflective layer 20, and the transparent protective layer 30, are adjusted to provide an infrared reflective film capable of simultaneously satisfying all of the aforementioned visible ray transmittance, normal emissivity and durability.

[Use Applications]

The infrared reflective film of the present invention can be suitably used for enhancing cooling and/or heating effects and preventing rapid temperature changes, in a state of being bonded to a window of a building, a vehicle or the like, a transparent casing for containing plants or the like, a freezer or refrigerator showcase, etc.

EXAMPLES

Although the present invention will be described in detail based on various examples, it is to be understood that the present invention is not limited to the following examples.

[Measurement Method Used in Inventive and Comparative Examples]

<Thickness of Each Layer>

A sample was machined by a focused ion beam (FIB) process using a focused ion beam machining and observation apparatus (product name "FB-2100", produced by Hitachi, Ltd.), and a cross-section of the resulting sample was observed by a field-emission type transmission electron microscope (product name "HF-2000", produced by Hitachi, Ltd.) to thereby determine respective thicknesses of the layers making up the infrared reflective layer. Respective thicknesses of the hard coat layer formed on the backing, and the transparent protective layer, were calculationally determined from an interference pattern caused by reflectance of visible rays when light is entered from the side of the measurement target, by using an instantaneous multi-photometric system (product name "MCPD 3000", produced by Otsuka Electronics Co., Ltd.). In a situation where the observation of an interference pattern in the visible ray range was difficult due to a small thickness (about 150 nm or less) of the transparent protective layer, the thickness was determined through the transmission electron microscopic observation, as with the layers of the infrared reflective layer.

<Normal Emissivity>

The normal emissivity was determined by measuring an infrared specular reflectance at a wavelength of 5 to 25 nm, using a Fourier transform infrared (FT-IR) spectrometer equipped with angle variable reflection accessories (produced by Varian Medical Systems, Inc.), according to JIS R 3106-2008 (Testing method for transmittance, reflectance, reflectance, emissivity and solar heat gain coefficient of flat glasses).

<Abrasion Resistance Test>

A laminate prepared by cutting the infrared reflective film into a size of 12 cm×3 cm, and bonding a surface of the resulting infrared reflective film on the side of the transparent film backing to aluminum plate through a 25 nm-thick pressure-sensitive adhesive layer was used as a sample. The transparent film backing-side surface of the sample of the infrared reflective film was rubbed within its length range of 10 cm by an alcohol-type wet tissue (Kohnan Shoji Co., Ltd.) while being subjected to 500 g of load applied therefrom, over 1000 strokes, using a Gakushin-type color fastness rubbing tester (produced by Yasuda Seiki Seisakusho Ltd.). The presence or absence of scratch or spalling in the transparent protective layer of the sample after completion of the test was visually checked, and evaluation was performed in accordance with the following evaluation criteria.

⊚: No scratch was observed in the surface.

○: No spalling occurred although fine scratches were observed in the surface.

x: A large number of scratches and spalling were observed in the surface.

<Salt Water Resistance Test>

A laminate prepared by bonding the transparent film backing-side surface of the infrared reflective film to a glass plate having a size of 3 cm×3 cm through a 25 μm-thick pressure-sensitive adhesive layer was used as a sample. This sample was immersed in an aqueous solution containing 5 weight % of sodium chloride, and a container containing the sample and the aqueous sodium chloride solution was put into a dryer at 50° C. Then, after 5 days and after 10 days, a variation in emissivity and a change in external appearance were checked, and evaluation was performed in accordance with the following evaluation criteria.

⊚: Even after immersion for 10 days, no change in external appearance was observed, and the variation in emissivity was 0.02 or less.

○: After immersion for 5 days, no change in external appearance was observed and the variation in emissivity was 0.02 or less. Then, after immersion for 10 days, a change in external appearance was observed.

Δ: After immersion for 5 days, the variation in emissivity was 0.02 or less although a change in external appearance was observed.

x: After immersion for 5 days, a change in external appearance was observed, and the variation in emissivity was 0.02 or more.

<External Appearance (Rainbow-Like Coloring Phenomenon)>

Beneath fluorescent light, reflected colors of the transparent film backing-side surface of the infrared reflective film were visually checked, and evaluation was performed in accordance with the following evaluation criteria.

○: No rainbow-like coloring phenomenon occurred.

Δ: Slight coloring due to the rainbow-like coloring phenomenon was observed.

x: A rainbow-like pattern was observed on the surface due to the rainbow-like coloring phenomenon.

Inventive Example 1

(Formation of Hard Coat Layer onto Backing)

An acrylic-based ultraviolet-curable hard coat layer (trade name "NH2000G", produced by Nippon Soda Co., Ltd.) was formed with a thickness of 2 μm, on one surface of a 50 μm-thick polyethylene terephthalate film (trade name "Lumirror" U48, produced by Toray Industries Inc., visible ray transmittance: 93%). More specifically, a hard coat solution was applied to the film by a gravure coater, and, the resulting coating was dried at 80° C. and then subjected to curing by irradiation with ultraviolet rays in an integrated light amount of 300 mJ/cm$^2$, using an ultra-high pressure mercury lamp.

(Formation of Infrared Reflective Layer)

An infrared reflective layer was formed on the hard coat layer of the polyethylene terephthalate film backing by using a winding type sputtering apparatus. More specifically, a 30 nm-thick first metal oxide layer made of a zinc-tin composite oxide (ZTO), a 15 nm-thick metal layer made of an Ag—Pd alloy, and a 30 nm-thick second metal oxide layer made of ZTO were sequentially formed by a DC magnetron sputtering process. For forming each of the ZTO metal oxide layers, sputtering was performed under the following conditions: power density: 267 W/cm$^2$; and substrate temperature: 80° C., using a target prepared by sintering a mixture of zinc oxide, tin oxide and a metal zinc powder at a weight ratio of 10:82.5:7.5. In this process, an amount of gas to be introduced into a sputtering film formation chamber was adjusted to allow Ar:O$_2$ (volume ratio) to become 98:2. For forming the metal layer, a metal target containing silver and palladium at a weight ratio of 96:4 was used.

(Formation of Transparent Protective Layer)

A protective layer made of a fluorine-based ultraviolet-curable resin having a cross-linked structure derived from a phosphoric ester compound was formed with a thickness of 60 nm, on the infrared reflective layer. More specifically, a solution prepared by adding a phosphoric ester compound (product name "KAYAMER PM-21", produced by Nippon Kayaku Co., Ltd.) to a fluorine-based hard coat resin solution (product name "JUA204", produced by JSR Corporation) in an amount of 5 weight parts with respect to 100 weight % of a solid content of the fluorine-based hard coat resin solution was applied using an applicator, and the resulting coating was dried at 60° C. for 1 minute and then subjected to curing by irradiation with ultraviolet rays in an integrated light amount of 400 mJ/cm$^2$, using an ultra-high pressure mercury lamp, in a nitrogen atmosphere. The phosphoric ester compound is a mixture of: a phosphoric monoester compound having one acryloyl group in the molecule (a compound provided when X is a methyl group, and n and p are, respectively, 0 and 1 in the aforementioned chemical formula (1)), and a phosphoric diester compound having two acryloyl groups in the molecule (a compound provided when X is a methyl group, and n and p are, respectively, 0 and 2 in the aforementioned chemical formula (1)).

Inventive Example 2 and Inventive Example 3

Except that the thickness of the transparent protective layer was changed as presented in Table 1, each infrared reflective film was produced in the same manner as that in Inventive Example 1.

Inventive Example 4

In the process of forming the transparent protective layer, an acrylic-based hard coat resin solution (trade name "Z7535", produced by JSR Corporation) was used in place of the fluorine-based hard coat resin solution. Except for the above, an infrared reflective film was produced in the same manner as that in Inventive Example 1.

Inventive Examples 5 to 8

Except that an amount of the phosphoric ester compound to be added in the process of forming the transparent protective layer was changed as presented in Table 1, each infrared reflective film was produced in the same manner as that in Inventive Example 1.

Inventive Example 9

Except that indium-tin-aluminum-zinc-oxide (ITAZO) was used as each of the first metal oxide layer and the second metal oxide layer, in place of ZTO, each infrared reflective film was produced in the same manner as that in Inventive Example 1. For forming each of the ITAZO layers, an oxide target prepared by sintering a mixture of indium oxide, tin oxide, aluminum oxide and zinc oxide at a weight ratio of 45:5:1:49 was used as a sputtering target.

Inventive Example 10

As an additive (cross-linking agent) in the process of forming the transparent protective layer, a phosphoric monoester compound having one acryloyl group in the molecule (trade name "LIGHT ACRYLATE P-1A", produced by Kyoeisha Chemical Co., Ltd.) was used, in place of "KAYAMER PM-21". Except for the above, an infrared reflective film was produced in the same manner as that in Inventive Example 1.

Inventive Example 11

As an additive (cross-linking agent) in the process of forming the transparent protective layer, a denatured product of dipentaerythritol pentaacrylate-succinic acid (trade name "LIGHT ACRYLATE DPE-6A-MS", produced by Kyoeisha Chemical Co., Ltd.) was used, in place of the phosphoric monoester compound. Except for the above, an infrared reflective film was produced in the same manner as that in Inventive Example 1.

Inventive Example 12

In the process of forming the metal layer, a metal target containing silver and gold at a weight ratio of 90:10 was used, in place of the Ag—Pd alloy, to form a metal layer made of an Ag—Au alloy. Except for the above, an infrared reflective film was produced in the same manner as that in Inventive Example 1.

Comparative Examples 1 to 3

Except that the thickness of the transparent protective layer was changed as presented in Table 1, each infrared reflective film was produced in the same manner as that in Inventive Example 1.

Comparative Example 4

Except that no phosphoric ester compound was added in the process of forming the transparent protective layer, an infrared reflective film was produced in the same manner as that in Inventive Example 1.

Comparative Example 5 and Comparative Example 6

Except that the amount of the phosphoric ester compound to be added in the process of forming the transparent protective layer was changed as presented in Table 1, each infrared reflective film was produced in the same manner as that in Inventive Example 1.

Comparative Example 7 and Comparative Example 8

As an additive (cross-linking agent) in the process of forming the transparent protective layer, a phosphoric tri-ester compound having three (meth)acryloyl groups in the molecule was used, in place of "KAYAMER PM-21". Except for the above, each infrared reflective film was produced in the same manner as that in Inventive Example 1. As the cross-linking agent, tris(methacryloyloxy)ethyl phosphate (trade name "Biscoat #3 PMA", produced by Osaka Organic Chemical Industry Ltd.), and tris(acryloyloxy)ethyl phosphate (trade name "Biscoat #3 PA", produced by Osaka Organic Chemical Industry Ltd.) were used, respective, in Comparative Example 8 and Comparative Example 8. Each of these phosphoric esters is a triester in which all phosphoric acid-derived acidic groups (O=P—OH) are esterified, and has no acidic group in the molecule.

Comparative Example 9

Except that indium tin oxide (ITO) was used as each of the first metal oxide layer and the second metal oxide layer, in place of ZTO, an infrared reflective film was produced in the same manner as that in Inventive Example 1. For forming each of the ITO layers, an oxide target prepared by sintering a mixture of indium oxide and tin oxide at a weight ratio of 90:10 was used as a sputtering target.

Comparative Example 10

Except that indium zinc oxide (IZO) was used as each of the first metal oxide layer and the second metal oxide layer, in place of ZTO, an infrared reflective film was produced in the same manner as that in Inventive Example 1. For forming each of the IZO layers, an oxide target prepared by sintering a mixture of indium oxide and zinc oxide at a weight ratio of 90:10 was used as a sputtering target.

Respective configurations (a material for the metal oxide layers, and a thickness of the transparent protective layer, and a type and an amount of the cross-linking agent) and respective evaluation results of the infrared reflective films in the above Inventive and Comparative Examples are presented in Table 1.

TABLE 1

| | Infrared Reflective Layer | Transparent Protective Layer | | | Evaluation Result | | | |
| --- | --- | --- | --- | --- | --- | --- | --- | --- |
| | | | Cross-linking Agent | | | | | |
| | Material for Metal Oxide Layer | Thickness (nm) | Material | Content (weight part) | Abrasion Resistance | Salt Water resistance | Rainbow-like Coloring Phenomenon | Emissivity |
| Inventive Example 1 | ZTO | 60 | PM-21 | 5 | ⊚ | ⊚ | ○ | 0.07 |
| Inventive Example 2 | ZTO | 40 | PM-21 | 5 | ○ | ⊚ | ○ | 0.07 |
| Inventive Example 3 | ZTO | 150 | PM-21 | 5 | ⊚ | ⊚ | Δ | 0.07 |
| Inventive Example 4 | ZTO | 60 | PM-21 | 5 | ⊚ | ⊚ | ○ | 0.07 |
| Inventive Example 5 | ZTO | 60 | PM-21 | 1 | ○ | ⊚ | ○ | 0.07 |
| Inventive Example 6 | ZTO | 60 | PM-21 | 2.5 | ⊚ | ⊚ | ○ | 0.07 |
| Inventive Example 7 | ZTO | 60 | PM-21 | 10 | ⊚ | ⊚ | ○ | 0.07 |
| Inventive Example 8 | ZTO | 60 | PM-21 | 35 | ○ | ⊚ | ○ | 0.07 |
| Inventive Example 9 | ITAZO | 60 | PM-21 | 5 | ⊚ | ○ | ○ | 0.07 |
| Inventive Example 10 | ZTO | 60 | P-1A | 5 | ⊚ | ⊚ | ○ | 0.07 |
| Inventive Example 11 | ZTO | 60 | DPE6A-MS | 5 | ○ | ⊚ | ○ | 0.07 |
| Inventive Example 12 | ZTO | 60 | PM-21 | 5 | ⊚ | ⊚ | ○ | 0.06 |
| Comparative Example 1 | ZTO | 20 | PM-21 | 5 | X | ⊚ | ○ | 0.07 |
| Comparative Example 2 | ZTO | 200 | PM-21 | 5 | ⊚ | ⊚ | X | 0.08 |
| Comparative Example 3 | ZTO | 950 | PM-21 | 5 | ⊚ | ⊚ | X | 0.22 |
| Comparative Example 4 | ZTO | 60 | — | | X | ⊚ | ○ | 0.07 |
| Comparative Example 5 | ZTO | 60 | PM-21 | 0.5 | X | ⊚ | ○ | 0.07 |
| Comparative Example 6 | ZTO | 60 | PM-21 | 50 | X | ⊚ | ○ | 0.07 |
| Comparative Example 7 | ZTO | 60 | 3PMA | 5 | X | ⊚ | ○ | 0.07 |
| Comparative Example 8 | ZTO | 60 | 3PA | 5 | X | ⊚ | ○ | 0.07 |
| Comparative Example 9 | ITO | 60 | PM-21 | 5 | ⊚ | X | ○ | 0.06 |
| Comparative Example 10 | IZO | 60 | PM-21 | 5 | ⊚ | Δ | ○ | 0.07 |

PM-21: Mixture of phosphoric monoester compound and phosphoric diester compound
P-1A: Phosphoric monoester compound
DPE6A-MS: Denatured product of dipentaerythritol pentaacrylate-succinic acid
3PMA, 3PA: Phosphoric triester compound As is evident from Table 1, each of the infrared reflective films in Inventive Examples 1 to 12 is reduced in terms of emissivity and suppressed in terms of the rainbow-like coloring phenomenon, while ensuring abrasion resistance and salt water resistance.

Comparing Inventive Examples 1 to 3 to Comparative Examples 1 to 3, wherein the thickness of the transparent protective layer is changed, the rainbow-like coloring phenomenon was significantly observed in Comparative examples 2 and 3 where the thickness of the transparent protective layer is set to excessively large values. Moreover, in Comparative Example 3, the emissivity was significantly increased due to the excessively increased thickness of the transparent protective layer. Further, in Comparative Example 1 where the thickness of the transparent protective layer is set to 20 nm, the abrasion resistance was evaluated as x. This shows that physical strength is insufficient due to the excessively small thickness. In contrast, each of Inventive Examples 1 to 3 exhibited good results. In particularly, the thickness of the transparent protective layer may be adjusted to fall within the range of about 45 to 100 nm, as Inventive Example 1. This can be deemed as particularly preferable means to achieve excellent abrasion resistance while preventing the rainbow-like coloring phenomenon from being observed.

Comparing Inventive Examples 1 and 5 to 8 to Comparative Examples 5 and 6, wherein the amount of the phosphoric ester compound is changed, in each of Comparative example 5 where the amount of the phosphoric ester compound is set to an excessively small value and Comparative example 6 where the amount of the phosphoric ester compound is set to an excessively large value, the abrasion resistance was evaluated as x. On the other hand, among Inventive Examples 1 and 5 to 8, Inventive Examples 1, 6 and 7 exhibited excellent abrasion resistance. These results show that as particularly preferable means to enhance the physical strength of the transparent protective layer, the amount of the phosphoric ester compound may be set to be in the range of about 2.5 to 12.5 weight %.

In Comparative Examples 7 and 8 where a phosphoric triester compound containing no acidic group in the molecule is used, the abrasion resistance was evaluated as x. Further, comparing Inventive Examples 1 and 10 to Inventive Example 11, each of Inventive Examples 1 and 10 where a phosphoric ester is used as the cross-linking agent had further enhanced abrasion resistance than Inventive Example 11 where a succinic acid ester is used as the cross-linking agent. These results show that as means to enhance the physical strength of the transparent protective layer and the adhesion with respect to the transparent protective layer, simply containing a cross-linked structure is not enough, but it is necessary to introduce a cross-linked structure derived from an ester having an acidic group. Further, as the ester, it is particularly preferable to use phosphoric monoester or phosphoric diester in which a phosphoric acid-derived acidic group (O=P—OH) remains.

Inventive Example 4 where an acrylic-based curable polymer is used as a curable resin as a primary component of the transparent protective layer exhibited durability substantially equal to that in Inventive Example 1. From this result, it can be understood that the introduction of the ester compound-derived cross-linked structure is critical in imparting durability and adhesion to the infrared reflective film.

Inventive Example 12 where the metal layer of the infrared reflective layer is formed using an Ag—Au alloy, instead of an Ag—Pd alloy, exhibited durability substantially equal to that in Inventive Example 1. Inventive Example 9 where ITAZO is used as the material for each of the metal oxide layers of the infrared reflective layer exhibited durability substantially equal to that in Inventive Example 1. On the other hand, in Comparative Example 9 using ITO and Comparative Example 9 using IZO, the salt water resistance deteriorated. This means poor chemical stability. The above results show that, in the present invention, durability of the infrared reflective layer can be enhanced by using, as a material for the metal oxide layer, a composite metal oxide containing both zinc oxide and tin oxide.

LIST OF REFERENCE SIGNS

100: infrared reflective film
10: transparent film backing
20: infrared reflective layer
21, 22: metal oxide layer
25: metal layer
30: protective layer
60: adhesive layer

The invention claimed is:

1. An infrared reflective film configured by disposing an infrared ray reflective layer and a transparent protective layer on a transparent film backing in this order,
   wherein the infrared ray reflective layer comprises: a first metal oxide layer; a metal layer comprising a primary component consisting of silver; and a second metal oxide layer comprised of a composite metal oxide containing zinc oxide and tin oxide, which are arranged in this order from a side of the transparent film backing,
   and wherein the transparent protective layer lies in direct contact with the second metal oxide layer, and has a thickness of 30 nm to 150 nm, the transparent protective layer being an organic layer having a cross-linked structure derived from an ester compound having an acidic group and a polymerizable functional group in the same molecule, an amount of the ester compound-derived structure contained in the transparent protective layer being 1 to 40 weight %.

2. The infrared reflective film as recited in claim 1, wherein the ester compound is an ester compound of a phosphoric acid with an organic acid having a polymerizable functional group.

3. The infrared reflective film as recited in claim 2, wherein a normal emissivity as measured from the side of the transparent protective layer is 0.2 or less.

4. The infrared reflective film as recited in claim 2, wherein the polymerizable functional group comprises a (meth) acryloyl group.

5. The infrared reflective film as recited in claim 1, wherein a normal emissivity as measured from the side of the transparent protective layer is 0.2 or less.

6. The infrared reflective film as recited in claim 1, wherein the ester compound is a phosphoric monoester compound.

7. The infrared reflective film as recited in claim 1, wherein the ester compound is a phosphoric diester compound.

8. The infrared reflective film as recited in claim 1, wherein the ester compound is a combination of a phosphoric monoester compound and a phosphoric diester compound.

9. The infrared reflective film as recited in claim 1, wherein the transparent protective layer comprises at least one of a coupling agent, a leveling agent, an ultraviolet absorber, an antioxidant, a stabilizer, a plasticizer, a coloration inhibitor, a flame retardant, or an antistatic agent.

10. The infrared reflective film as recited in claim 9, wherein the coupling agent comprises at least one of a silane coupling agent or a titanium coupling agent.

11. The infrared reflective film as recited in claim 9, wherein the stabilizer is a heat stabilizer.

12. The infrared reflective film as recited in claim 1, wherein the amount of the ester compound-derived structure contained in the transparent protective layer is from 1.5 to 35 weight %.

13. The infrared reflective film as recited in claim 1, wherein the amount of the ester compound-derived structure contained in the transparent protective layer is from 2 to 20 weight %.

14. The infrared reflective film as recited in claim 1, wherein the amount of the ester compound-derived structure contained in the transparent protective layer is from 2.5 to 17.5 weight %.

15. The infrared reflective film as recited in claim 1, wherein the thickness of the transparent protective layer is 35 to 130 nm.

16. The infrared reflective film as recited in claim 1, wherein the thickness of the transparent protective layer is from 40 to 110 nm.

17. The infrared reflective film as recited in claim 1, wherein a normal emissivity as measured from the side of the transparent protective layer is 0.15 or less.

18. The infrared reflective film as recited in claim 1, wherein a normal emissivity as measured from the side of the transparent protective layer is 0.12 or less.

19. The infrared reflective film as recited in claim 1, wherein a visible ray transmittance of the infrared reflective film is 60% or more.

20. The infrared reflective film as recited in claim 1, wherein a visible ray transmittance of the infrared reflective film is 65% or more.

* * * * *